US006859405B2

(12) United States Patent
Lee et al.

(10) Patent No.: US 6,859,405 B2
(45) Date of Patent: Feb. 22, 2005

(54) SEMICONDUCTOR MEMORY DEVICE HAVING IMPROVED BIT LINE SENSING OPERATION AND METHOD FOR DRIVING POWER IN A BIT LINE SENSE AMPLIFIER OF THE SEMICONDUCTOR MEMORY DEVICE

(75) Inventors: Bum-Jae Lee, Suwon (KR); Su-A Kim, Anyang (KR); Kyu-Nam Lim, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/465,634

(22) Filed: Jun. 20, 2003

(65) Prior Publication Data

US 2004/0120194 A1 Jun. 24, 2004

(30) Foreign Application Priority Data

Dec. 23, 2002 (KR) .................................. 10-2002-0082300

(51) Int. Cl.[7] .............................................. G11C 7/00
(52) U.S. Cl. ...................................... 365/205; 365/203
(58) Field of Search ................................. 365/205, 203, 365/226, 207

(56) References Cited

U.S. PATENT DOCUMENTS

| 5,339,273 | A | * | 8/1994 | Taguchi | ...................... 365/201 |
| 5,848,015 | A | * | 12/1998 | Seno | ........................... 365/203 |
| 6,046,948 | A | * | 4/2000 | Zheng et al. | ............... 365/203 |
| 6,272,059 | B1 | | 8/2001 | Ryu et al. | |

* cited by examiner

*Primary Examiner*—Thong Q. Le
(74) *Attorney, Agent, or Firm*—Harness, Dickey & Pierce, P.L.C.

(57) ABSTRACT

A semiconductor memory device having a bit line sense amplifier connected to a bit line pair may include a precharge part to precharge first and second drive nodes of the bit line sense amplifier to an equal voltage level. The device may include a switching part operatively connecting the first and second precharge nodes to the first and second drive nodes in response to sense amplifier drive signals applied during a data non-access mode. To drive power in the bit line sense amplifier, the precharge voltage may be applied in a precharge state to precharge the first and second drive nodes to the equal voltage level, the device may shift from the precharge state to an operational state to cut off the applied precharge voltage, and driving voltages may be applied to the first and second drive nodes to power the bit line sense amplifier of the device.

34 Claims, 7 Drawing Sheets

SEMICONDUCTOR MEMORY DEVICE HAVING IMPROVED BIT LINE SENSING OPERATION AND METHOD FOR DRIVING POWER IN A BIT LINE SENSE AMPLIFIER OF THE SEMICONDUCTOR MEMORY DEVICE

PRIORITY STATEMENT

This U.S. non-provisional patent application claims priority under 35 U.S.C. § 119 of Korean Patent Application 2002-82300, filed on Dec. 23, 2002, the entire contents of which are hereby incorporated by reference.

BACKGROUND OF THE INVENTION

1. Field of the Invention

The exemplary embodiment of the present invention relate to a bit line sensing operation in a volatile semiconductor memory device.

2. Description of the Related Art

In general, as recent technology shifts toward high speed operations in semiconductor memory devices such as a dynamic random access memory (DRAM) etc. which are performed at a relatively low power, the voltage used to access data, (i.e., voltage needed for a read or write operation), is gradually lowering. Thus, as a data sensing margin becomes more critical, a bit line data sensing operation may become more susceptible to peripheral influences, such as noise, for example.

FIG. 1 is a circuit drawing illustrating a drive of a prior art bit line sense amplifier in a semiconductor memory device. Referring to FIG. 1, a plurality of bit line sense amplifiers (1,2, . . . ,n), each of which is composed of a pull-up P-type sense amplifier 4 and a pull-down N-type sense amplifier 5 that are connected to a bit line pair B/L and B/LB, share a precharge part 10. A first drive mode LA and a second drive node LAB of bit line sense amplifier 1 are individually connected to first and second precharge nodes of the precharge part 10. Thus, during a precharged state (i.e., a data non-access mode), the first and second drive nodes LA, LAB are equally precharged by a voltage source VBL applied to node no1. Also in this circuitry, a state of the bit line pair B/L, B/LB is generally precharged to a half voltage source by a bit line precharge circuit (not shown).

The circuit of FIG. 1 including the bit line sense amplifiers (1,2, . . . ,n) has been simplified for convenience of explanation. The circuit further includes an input/output gate part disposed between the P-type sense amplifier 4 and the N-type sense amplifier 5, and a memory cell array. The memory cell array typically may have a matrix shape, and may include unit memory cells formed at each of points crossed between word lines and the bit line pairs B/L, B/LB. Each unit memory cell may be composed of an access transistor and a storage capacitor, for example.

Although omitted for convenience of explanation, the circuit of FIG. 1 further includes an isolation element (not shown) disposed between the P-type sense amplifier 4 and its adjacent memory cell, and between the N-type sense amplifier 5 and its adjacent memory cell. The isolation element would be driven by each block selection signal to electrically isolate the bit line pair B/L, B/LB from an input/output gate line pair (not shown in FIG. 1 for clarity, but generally referred to as "I/O, I/OB").

When an operating mode is changed from a precharge state (i.e., data non-access mode) to a data access mode, a P-type sense amplifier drive signal LAPG2 is applied as a logic level low, and an N-type sense amplifier drive signal LANG is applied as a logic level high. Then, an array voltage source Vcca applied from a power supply line part (not shown) is applied to first drive node LA of P-type sense amplifier 4 through a source/drain channel of a P-type MOS transistor PM1.

In FIG. 1, one of two voltage sources VDD and Vcca is selectively applied to the first drive node LA in a data access mode to enhance performance. When a system including a semiconductor memory device is powered on, a first P-type sense amplifier drive signal LAPG1 is initially applied as a logic level low, and a second P-type sense amplifier drive signal LAPG2 is applied as a logic level high. Then, upon a stable operation of the semiconductor memory device (i.e., when the memory device has powered up an stabilized)), LAPG1 becomes high and LAPG2 becomes low. The voltage source VDD is a external voltage source applied to the circuit of FIG. 1, and cell array voltage source Vcca is an internal voltage source stably generated from an array voltage source generator such as may be arranged on a semiconductor chip.

The N-type sense amplifier drive signal LANG becomes a logic level high, thus an N-type driver 40 (comprised of N-type MOS transistors (ND1,ND2, . . . ,NDn)) is turned on and voltage at second drive node LAB of the N-type sense amplifier 5 becomes a level of a ground voltage Vssa.

A pull-up operation of the P-type sense amplifier 4 is now explained. When the data access mode in the circuit of FIG. 1 is configured for a read operation, a row address strobe (RASB) is enabled and a word line selected by an address decoder (not shown) is activated. Therefore the charge of selected memory cells is transferred to corresponding bit line pairs, so as to induce a charge sharing operation among the bit line pairs. If a potential difference in a bit line pair occurs (i.e., between bit line B/L and complementary bit line B/LB), one of MOS transistors P1 and P2 of P-type sense amplifier 4 is turned on, so that potential of one of the bit lines (B/L or B/LB) rises to Vcca.

A pull-down operation of the N-type sense amplifier 5 is now described. During a read operation as described above, one of MOS transistors N1 and N2 of the N-type sense amplifier 5 whose gate is connected to the bit line that rises to Vcca, is strongly turned on to immediately rise to Vcca, as compared to another N-type MOS transistor in N-type sense amplifier 5 that is not connected to the bit line. Thus, in bit line pair B/L, B/LB, the potential of the other bit line (the other of B/L and B/LB that does not smartly rise to Vcca,) drops to Vssa.

Accordingly, sensing of the bit line data may thus be conducted in accordance with the pull-up and pull-down operations of the P-type sense amplifier 4 and N-type sense amplifier 5. The cell array voltage source Vcca applied to the first drive node LA, and the ground voltage source Vssa applied to the second drive node LAB of the bit line sense amplifier may be used as power sources for respective read or write operations in the memory cell array.

As described above, the bit line sense amplifiers (1 to n) share a precharge part 10, a P-type driver 20 and a P-type MOS transistor PM1. P-type driver 20 supplies a first voltage source (VDD) in response to the first P-type sense amplifier drive signal LAPG1. VDD is distributed to each sense amplifier 1 to n. The P-type MOS transistor PM1 supplies a second voltage source (Vcca) to sense amplifies 1 ton in response to the second P-type sense amplifier drive signal LAPG2.

The circuit of FIG. 1 may have a shortcoming, in that speed of a bit line data sensing operation may be degraded due to the influence of adjacent bit lines. One cause for the degradation of the sensing speed may be due to noise that may be prevalent in the sharing structure of the P-type driver 20 that includes P-type MOS transistor PM1, as shown in FIG. 1. However, recent technology has evolved to speed up sensing operations, in an effort to overcome the problems due to sharing the P-type MOS transistor PM1 in the circuit of FIG. 1.

FIG. 2 is a circuit drawing illustrating another drive of a prior art bit line sense amplifier in a semiconductor memory device. For consistency, like components in FIG. 2 maintain the same reference symbols as in FIG. 1, for except for additional or different components that are otherwise identified below.

Referring to FIG. 2, the precharge part 10 has been omitted and a second P-type driver 30 for independently supplying cell array voltage source Vcca to each bit line sense amplifier has been added. In other words, P-type MOS transistors (PD12, PD22, PDn2) of the second P-type driver 30 are disposed at each bit line pair (B/L, B/LB), thus there is no noise influence between the sense amplifiers 1 to n.

The circuit of FIG. 2 thus implements what may be referred to as an independent power drive method. The independent power drive method shown in FIG. 2 has a quicker bit line data sensing speed, as compared to circuit of FIG. 1, but voltage levels of the first and second drive nodes (LA, LAB) assume a floating state in the data non-access mode. This floating state, where voltages at LA and LAB may change, occurs because the circuit of FIG. 2 does not employ the precharge part 10 for precharging the first and second drive nodes (LA, LAB).

FIGS. 3a and 3b illustrate problems related to the drive of the prior art bit line sense amplifier shown in FIG. 2. Referring FIG. 3a, when noise is momentarily applied to the N-type driver 40 through a gate of an N-type MOS transistor ND1 (in this case, the second drive node LAB assumes a floating state in the data non-access mode), the N-type MOS transistor ND1 may be turned on. In this situation, if noise is applied to the N-type MOS transistor ND1 while receiving the N-type sense amplifier drive signal LANG through the gate of transistor ND1, potential of the second drive node LAB is reduced by a turn-on operation of transistor ND1. This may cause errors in a bit line data sensing operation. In other words, there may be a problem in that a pre-sensing operation is performed before a charge sharing operation, so as to cause a sensing error, for example.

FIG. 3b shows an example of a short occurring between the second drive node LAB and a line of the ground voltage Vssa, due to a manufacturing defect in the circuit of FIG. 2, for example. In this case, a sensing error may arise as described in the case of FIG. 3a. In FIG. 3b, if current noise is modeled through a current source (In0) between the second drive node LAB and the line of ground voltage Vssa, the debilitating influence of noise upon the sensing operation may be monitored. Accordingly, the independent power drive method implemented by the circuit of FIG. 2, may exhibit problems in which voltage levels of the first and second drive nodes assume a floating state in a data non-access mode. Thus, bit line data sensing cannot be stabilized.

SUMMARY OF THE INVENTION

Exemplary embodiments of the present invention are directed to a semiconductor memory device which may have improved bit line sensing operation, and to a method for driving power in a bit line sense amplifier of the semiconductor memory device. The device, which may include a bit line sense amplifier connected to a bit line pair, has a precharge part to precharge first and second drive nodes of the bit line sense amplifier to an equal voltage level. The device may include a switching part operatively connecting first and second precharge nodes to the first and second drive nodes in response to sense amplifier drive signals applied during a data non-access mode. To drive power in the bit line sense amplifier, the precharge voltage may be applied in a precharge state to precharge the first and second drive nodes to the equal voltage level, the device may shift from the precharge state to an operational state to cut off the applied precharge voltage, and driving voltages may be applied to the first and second drive nodes to power the bit line sense amplifier of the device.

BRIEF DESCRIPTION OF THE DRAWINGS

The above and other features of the exemplary embodiments of the present invention will become readily apparent from the description of exemplary embodiments that follows with reference to the accompanying drawings, in which like reference numerals and symbols designate like elements, in which.

DETAILED DESCRIPTION OF THE EXEMPLARY EMBODIMENTS

The exemplary embodiments of the present invention are more fully described below with reference to the accompanying drawings in FIGS. 4 through 7. The exemplary embodiments of the present invention may, however, be embodied in many different forms, and should not be construed as being limited to the exemplary embodiments set forth herein. These exemplary embodiments are provided so that the disclosure is thorough and complete, and so as to convey the concept of the present invention to those skilled in the art. Also, unless otherwise noted, components having the same or similar functions herein have the same or similar reference symbols as in FIGS. 1–3B.

Figure 4:
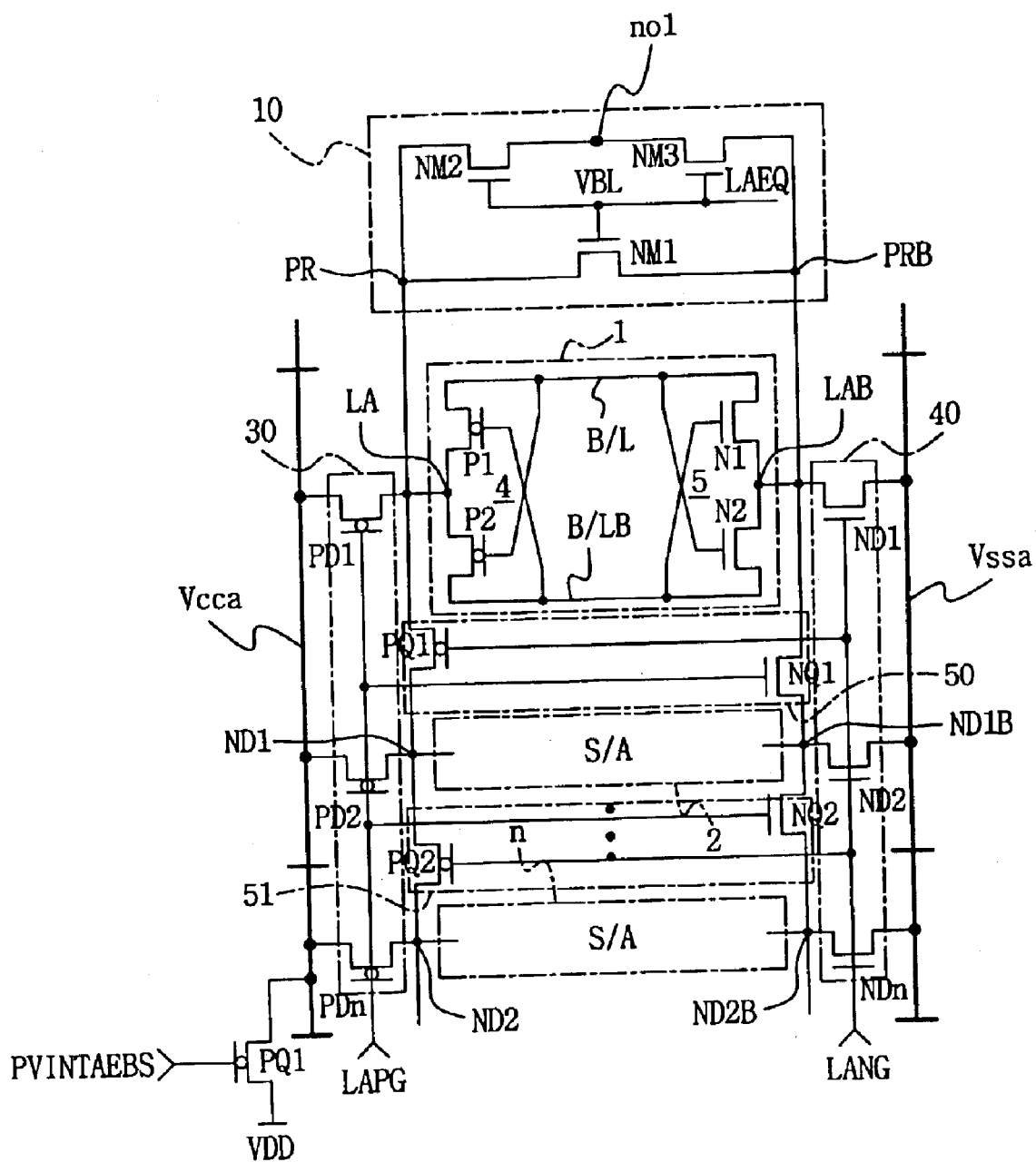
FIG. 4 is a circuit drawing illustrating a drive of a bit line sense amplifier according to an exemplary embodiment of the present invention.

FIG. 4 is a circuit drawing illustrating a drive of a bit line sense amplifier according to an exemplary embodiment of the present invention. Referring to FIG. 4, first and second drive nodes LA, LAB of bit line sense amplifiers (1,2, . . . , n), hereinafter "sense amplifiers 1 to n" for clarity to distinguish from P-type bit line sense amplifier 4 and N-type bit line sense amplifier 5) may be connected to first and second precharge nodes PR, PRB of a precharge part 10 for generating a precharge voltage.

Nodes ND1, ND1B of sense amplifier 2 may be individually connected to the first and second precharge nodes PR, PRB through a switching part 50. Switching part 50 may be composed of P-type MOS transistor PQ1 and N-type MOS transistor NQ1. Nodes ND2, ND2B of a bit line sense amplifier n may be connected to corresponding first and second precharge nodes PR, PRB via another switching part 51. Switching part 51 may be composed of a P-type MOS transistor PQ2 and an N-type MOS transistor NQ2, for example.

Memory cells may be formed at respective crossing points between bit line pairs B/L, B/LB of the sense amplifiers (1 to n) and word lines (not shown). The memory cells may thus form a memory cell array of a matrix shape, for example. Each sense amplifier 1 to n (each of which being composed of P-type bit line sense amplifier 4 and N-type bit line sense amplifier 5, for example) may be coupled with the bit line pair (B/L, B/LB) to which the memory cells are connected.

In response to a P-type sense amplifier drive signal LAPG P-type sense amplifier drive 30 applies an array voltage source Vcca to first drive node LA of P-type bit line sense amplifier 4. In response to an N-type sense amplifier drive signal LANG, N-type sense amplifier 40 applies a ground voltage Vssa to second drive node LAB of N-type bit line sense amplifier 5. The sense amplifier drive signals LAPG, LANG may be applied during a data access mode, for example.

The precharge part 10 may generate a precharge voltage through the first and second precharge nodes PR, PRB. This precharge voltage may precharge the first and second drive nodes LA, LAB equally (to the same voltage), in response to an equalizing control signal LAEQ. The equalizing control signal LAEQ may be applied during a data non-access mode. This precharge part 10 may be distinguished from a bit line precharge part for precharging the bit line pairs B/L, B/LB. That is, the precharge part 10 (which includes N-type MOS transistors NM1, NM2, NM3), precharges the first and second drive nodes LA, LAB to an equal voltage level. A precharge voltage source VBL may be generally supplied at a voltage level of a half voltage source to a node (no1) of the precharge part 10, for example.

The circuit of FIG. 4 has been simplified for the sake of explanatory convenience. Similar to the explanation for FIG. 1, an input/output gate part and an isolation element have been omitted from FIG. 4. The precharge part 10 shown in FIG. 4 may be disposed at each sub-block. For example, in a DRAM of 512 Mb, four banks (each bank individually having 128 Mb) may be arranged so that one bank is divided into a total of 768 sub-blocks, where one sub-block may have 512×352 memory cells. One precharge part 10 thus relates to a bit line data sensing for the sub-block of 512×352 memory cells.

Switching parts 50 and 51 may operatively connect the first and second precharge nodes PR, PRB with the first and second drive nodes LA, LAB of the P-type and N-type bit line sense amplifiers 4, 5, in response to the sense amplifier drive signals LAPG, LANG applied during the data non-access mode. Accordingly, since first drive node LA and second drive node LAB can be precharged to a given, equal voltage via the switching parts 50, 51 and precharge nodes PR, PRB, the first and second drive nodes LA, LAB do not assume a floating state.

The P-type and N-type sense amplifier drive signals LAPG, LANG may be provided as a high level signal and a low level signal at a bit line precharge operation section, for example, and the equalizing control signal LAEQ may be provided as a high level signal. Thus, a voltage level of a half voltage source VBL, e.g., 1.75V, may be provided to first and second precharge nodes PR, PRB. Also, the P-type and N-type MOS transistors (PQ1, PQ2, NQ1, NQ2) of the switching parts 50, 51 may be turned on, to operatively connect the first and second drive nodes LA, LAB of the sense amplifiers (2, n) with the first and second precharge nodes PR, PRB, as shown in FIG. 4. Therefore, the first and second drive nodes LA, LAB of the sense amplifiers (2, n) may be precharged to a voltage level of the half voltage source, without floating during the data non-access mode, namely, during the precharge state.

In such a state, upon a shift from the precharge state (i.e., data non-access mode) to a data access mode (i.e.,, a read/write operation mode, also referred to as an 'operational state'), the P-type sense amplifier drive signal LAPG is provided as a low level signal, the N-type sense amplifier drive signal LANG is provided as a high level signal, and the equalizing control signal LAEQ is provided as a low level signal. Therefore, the operative connection between the first and second drive nodes LA, LAB of the sense amplifiers (2, n) and the first and second precharge nodes PR, PRB may be released. Accordingly, the circuit of FIG. 4 may employ an independent power drive system which simultaneously has a precharge part that is connected only in a precharge operating duration, in other words, only while the circuit is in a precharge state or data non-access mode.

Figure 1:
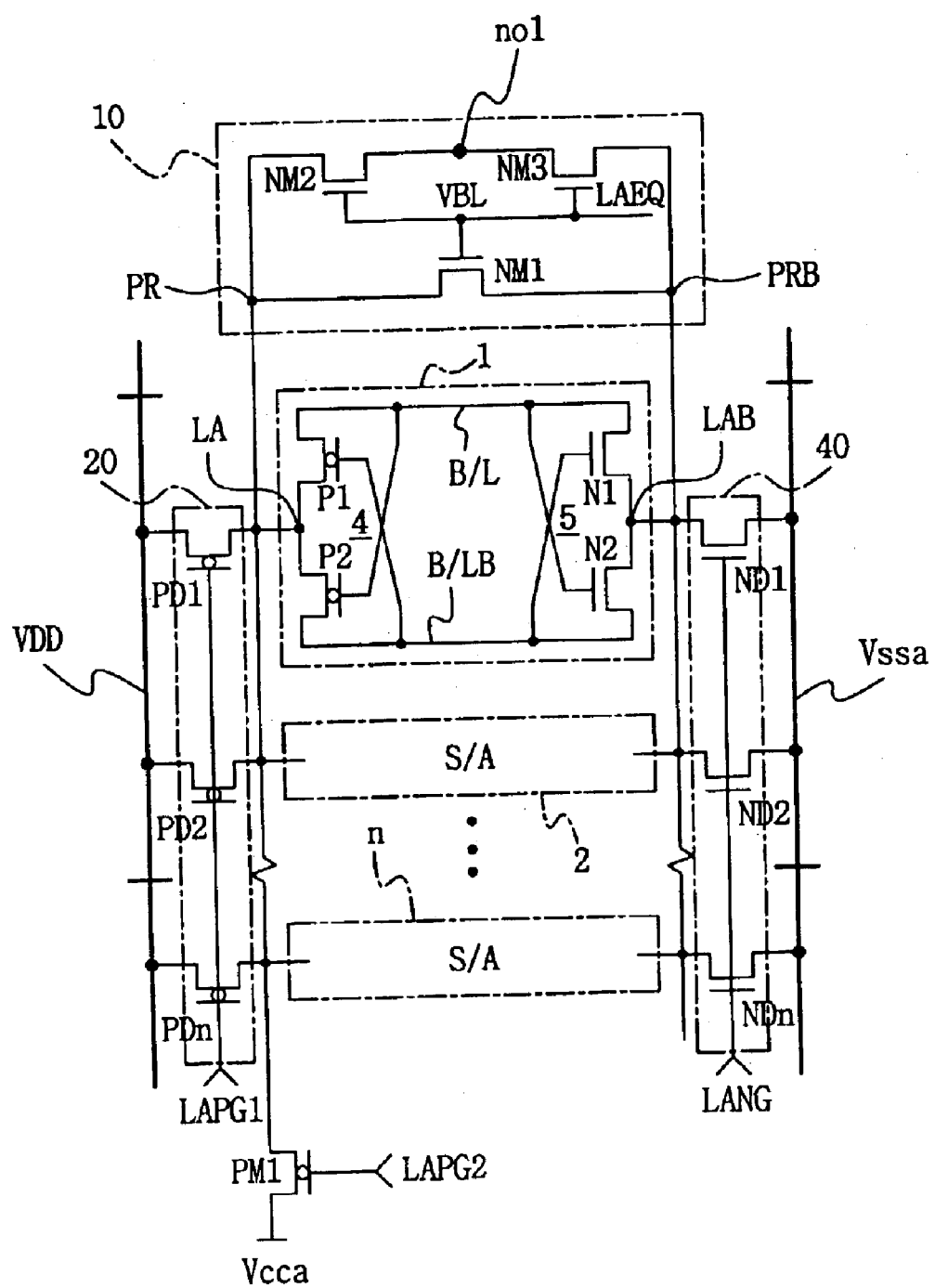
FIG. 1 is a circuit drawing illustrating a drive of a prior art bit line sense amplifier in a semiconductor memory device.
Figure 2:
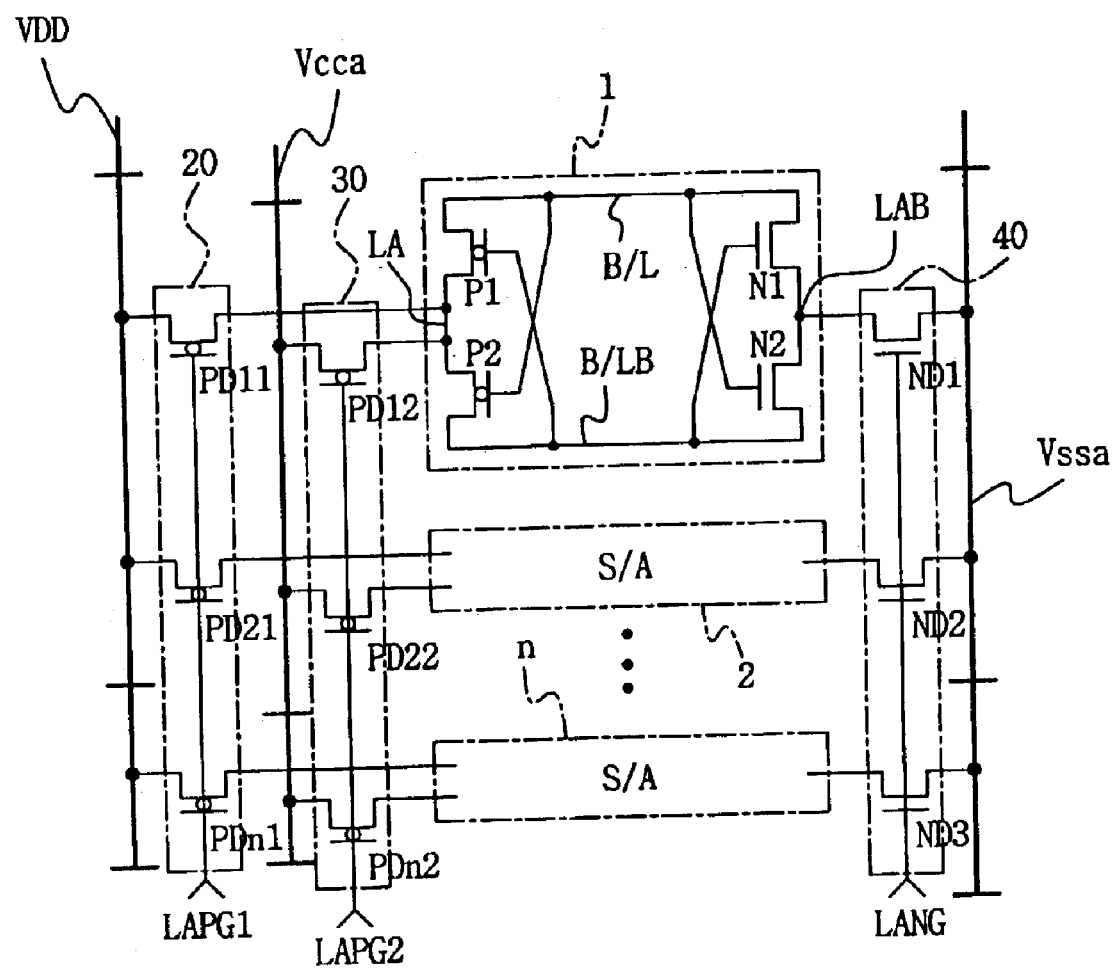
FIG. 2 is a circuit drawing illustrating another drive of a prior art bit line sense amplifier in a semiconductor memory device.
Figure 3A:
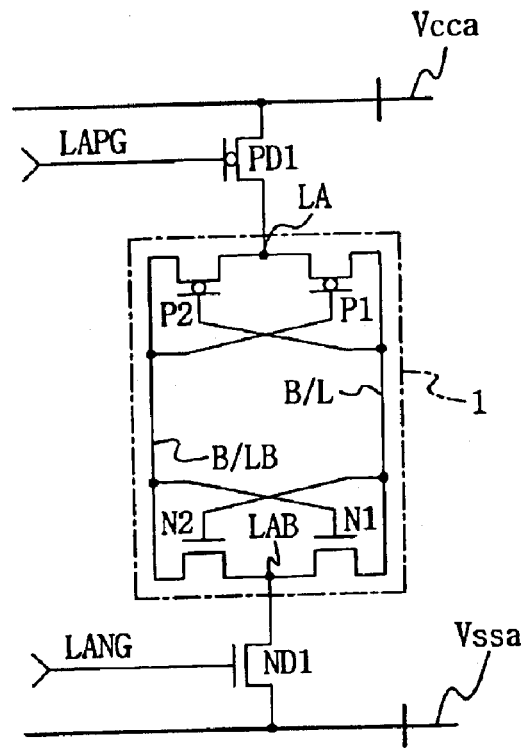
FIGS. 3a and 3b illustrate problems related to the drive of the prior art bit line sense amplifier shown in FIG. 2.
Figure 3B:
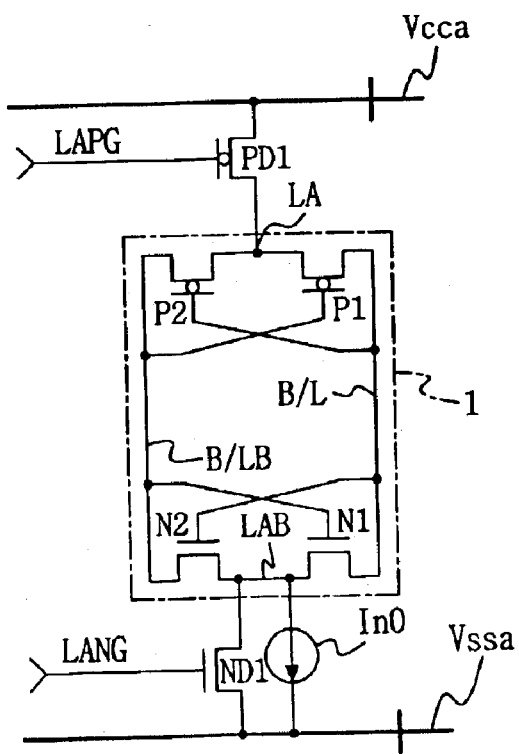
Figure 5:
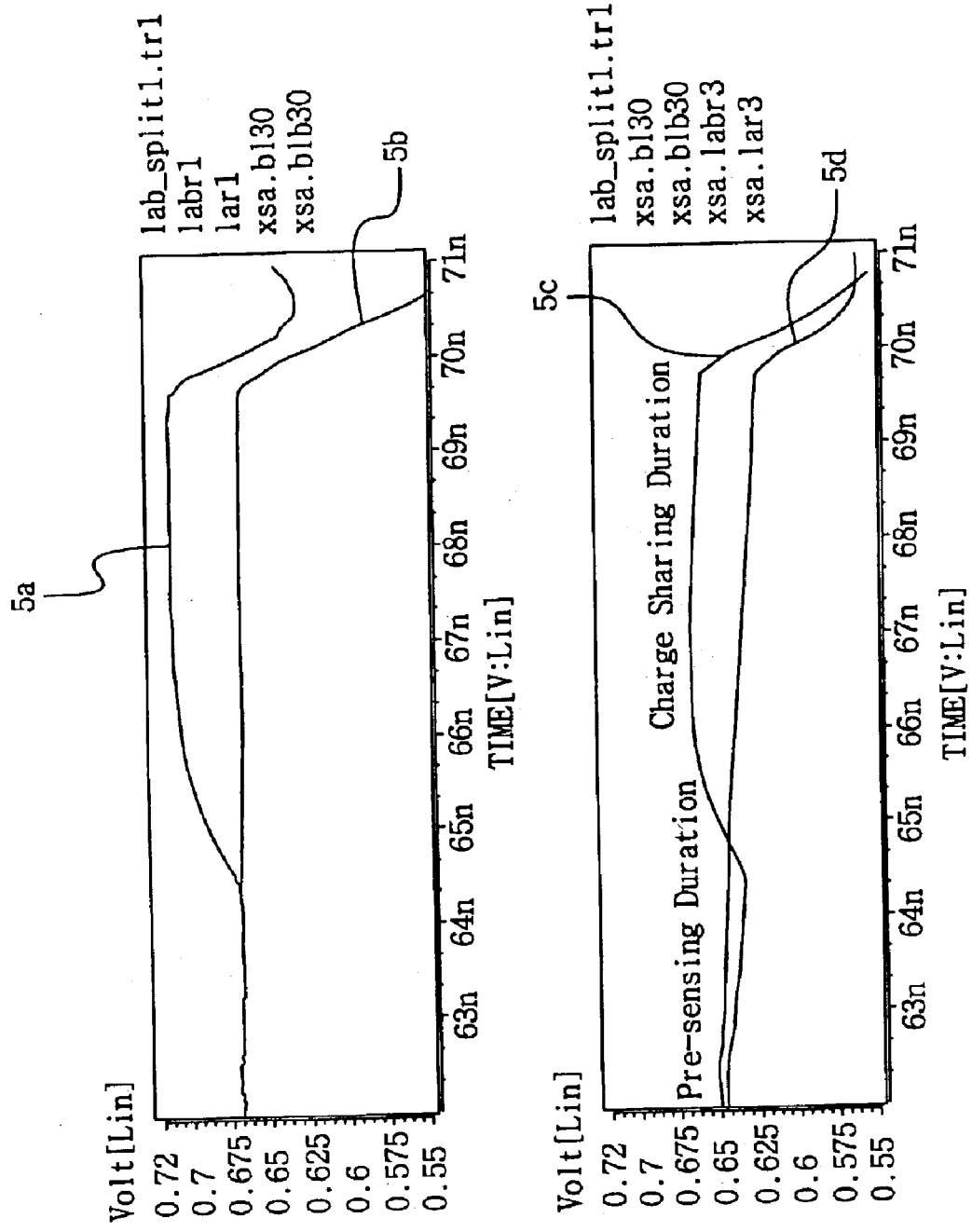
FIG. 5 is a simulation graph of data waveforms represented on a bit line pair in the circuits of FIGS. 2 and 4.

FIG. 5 is a simulation graph of data waveforms represented on a bit line pair in the circuits of FIGS. 2 and 4. In FIG. 5, the transverse axis (y-axis) of the graph indicates time in nanoseconds and a perpendicular axis (y-axis) indicates voltage. Reference symbols 5c and 5d represent bit line data sensing in the circuit of FIG. 2, and reference symbols 5a and 5b show bit line data sensing in the circuit of FIG. 4. In a case where the precharge part is omitted (as shown in the circuit of FIG. 2) the drive nodes LA, LAB float. Thus a pre-sensing duration exists, and data represented in the bit line pair (B/L, B/LB) may exhibit a crossing phenomenon known as a 'data inversion' within a charge sharing duration. The data inversion may be caused by influence of noise current that brings about an inverse pre-sensing occurrence.

Referring to 5a and 5b, a data sensing operation as implemented in the circuit of FIG. 4 may be stably executed, even though current noise is present at about 1 µA. Therefore, a substantially quick and stabilized bit line sensing operation may be realized with the independent power distribution system, as evident in the circuit structure of FIG. 4.

Figure 6:
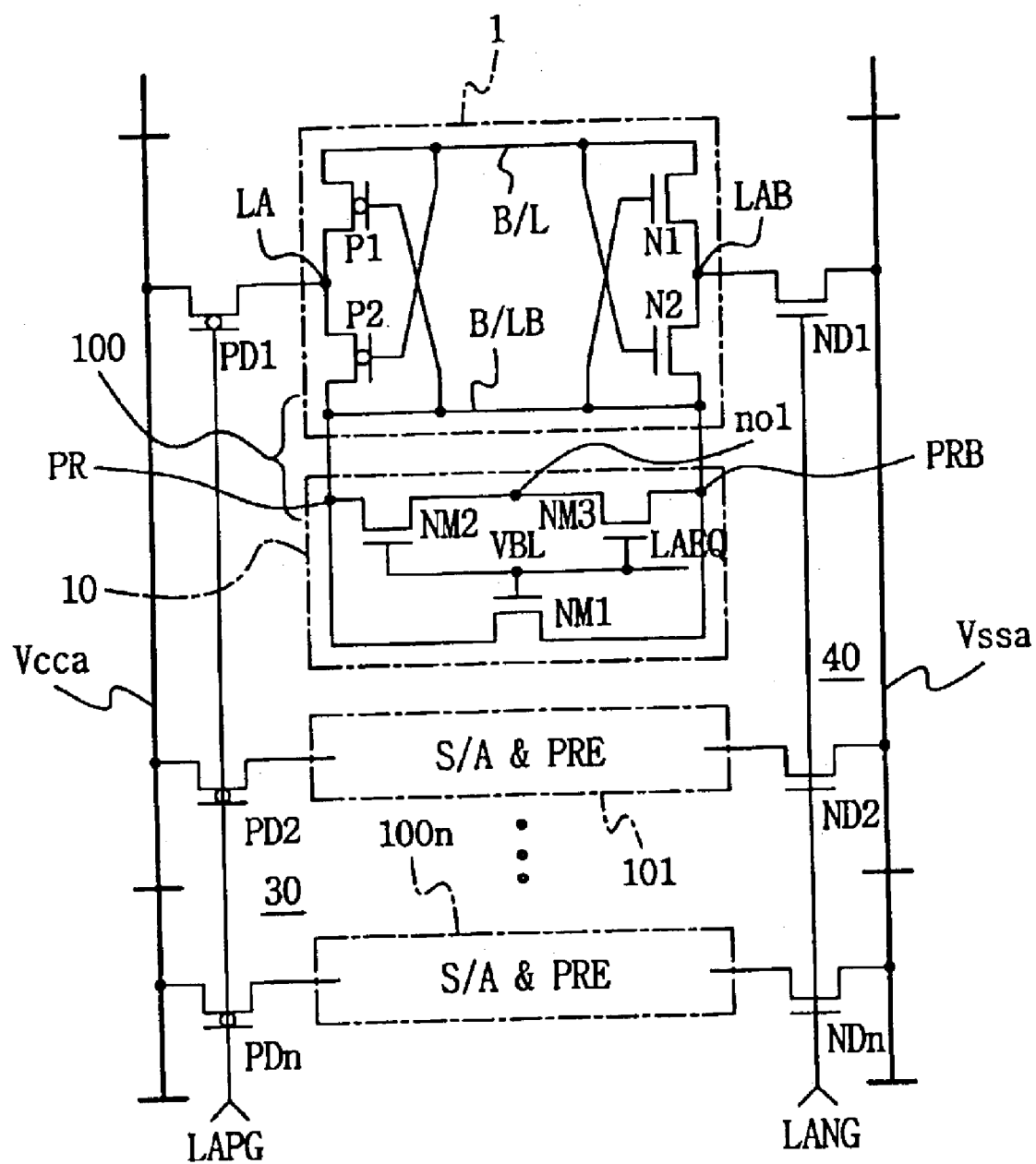
FIG. 6 is a circuit drawing illustrating a drive of a bit line sense amplifier according to another exemplary embodiment of the present invention.

FIG. 6 is a circuit drawing illustrating a drive of a bit line sense amplifier according to another exemplary embodiment of the present invention. Referring to FIG. 6, instead of employing switching parts 50 and 51, the precharge part 10 may be connected to each sense amplifier 1 to n. That is, the switching parts may be replaced by a plurality of blocks (100, 101, 100n) each block of which includes a bit line sense amplifier and a precharge part. In the data non-access mode, the circuit of FIG. 6 can also maintain a level of the half voltage source VBL without floating occurring in the first and second drive nodes LA, LAB.

Figure 7:
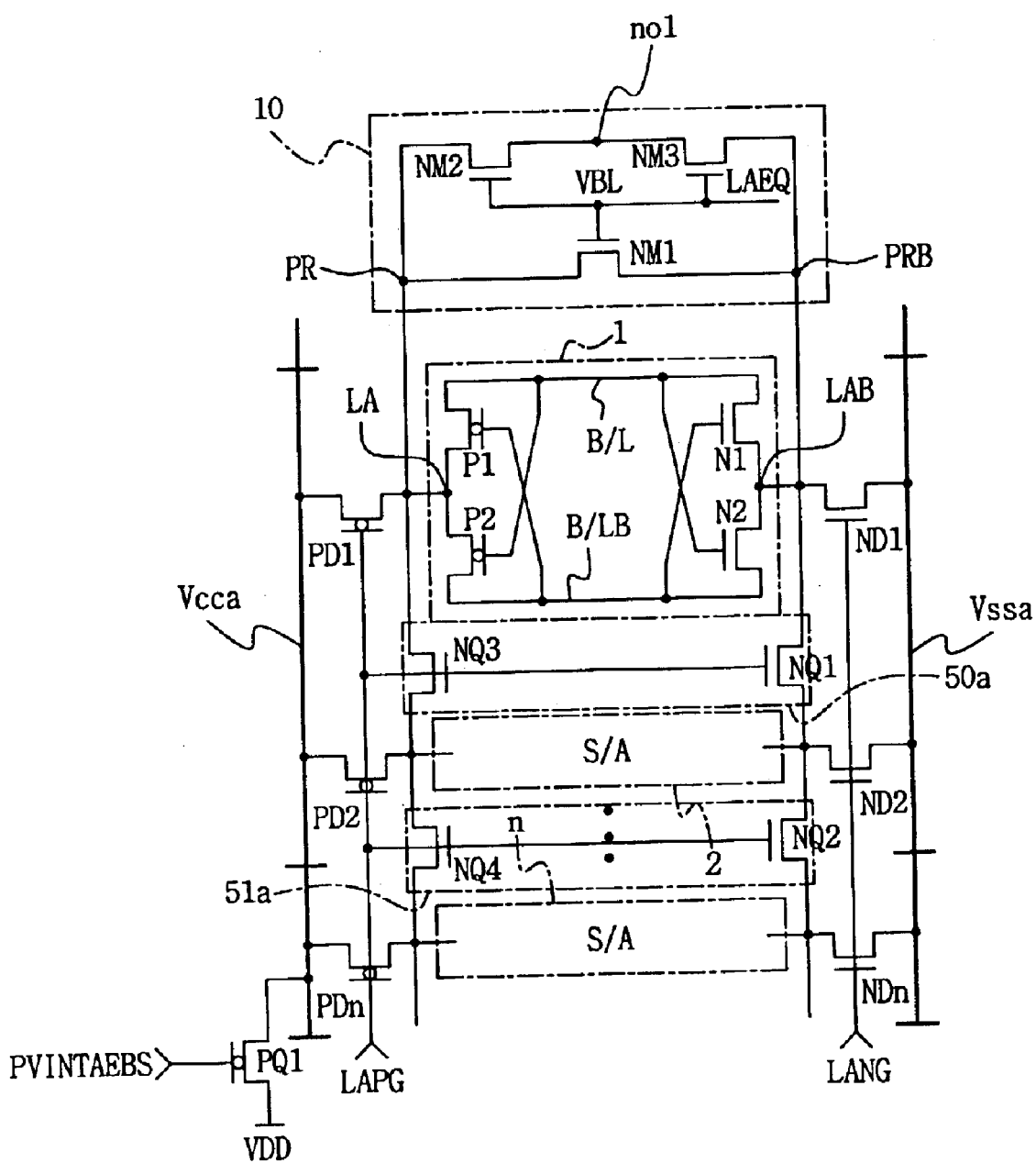
FIG. 7 is a circuit drawing illustrating a drive of a bit line sense amplifier according to another exemplary embodiment of the present invention.

FIG. 7 is a circuit drawing illustrating a drive of a bit line sense amplifier according to another exemplary embodiment of the present invention. Referring to FIG. 7, the structure of the switching parts 50, 51 shown in FIG. 4 may be altered so that switching parts 50a, 51a include N-type MOS transistors NQ1-NQ4. Gates of the N-type MOS transistors NQ1-NQ4 receive only the P-type sense amplifier drive signal LAPG.

In the circuit of FIG. 7, the data access and non-access operations are implemented as in the circuit of FIG. 4, but the switching parts 50a, 51a operate only in response to the P-type sense amplifier drive signal LAPG. Thus, the bit line sense amplifier may be driven by an independent power driving system without floating of the drive nodes LA, LAB when in a data non-access mode. Thereby, an error operation due to the pre-sensing, as shown by the waveforms in FIG. 5 for example, can be prevented. This may offer a stabilized bit line data sensing operation, even at substantially high operating speeds, such as may be prevalent in volatile an/or non-volatile semiconductor memory device.

As described above, within a semiconductor memory device in accordance with the exemplary embodiments of the present invention, drive nodes receiving a drive voltage to drive a bit line sense amplifier, for example, do not assume a floating state in a data non-access mode. Therefore an error operation due to a pre-sensing operation may be prevented, so as to perform stabilized bit line data sensing operations even at a high speed, potentially enhancing reliability for data sensing performance in the semiconductor memory device.

The exemplary embodiments of the present invention being thus described, it will be obvious that the same may be varied in many ways. For example, in an alternative exemplary embodiment, the orientation and/or location of the P-type and N-type drivers my be changed, and/or the wiring relation of the switching part(s) to other components in the circuits of FIGS. 4, 6 and 7 may be varied, in accordance with a desired application or circuit configuration. Such variations are not to be regarded as departure from the spirit and scope of the exemplary embodiments of the invention, and all such modifications as would be obvious to one skilled in the art are intended to be included within the scope of the following claims.

What is claimed is:

1. A semiconductor memory device having a bit line sense amplifier connected to a bit line pair, comprising:
   a precharge part generating a precharge voltage through first and second precharge nodes during a data non-access mode to precharge first and second drive nodes of the bit line sense amplifier to an equal voltage level; and
   a switching part operatively connecting the first and second precharge nodes to the first and second drive nodes in response to sense amplifier drive signals applied during the data non-access mode.

2. The device of claim 1, wherein the precharge part generates the precharge voltage in response to an equalizing control signal applied during the data non-access mode.

3. The device of claim 1, wherein the bit line sense amplifier includes an N-type sense amplifier and a P-type sense amplifier.

4. The device of claim 1, wherein a cell array voltage source is applied to the first drive node, and a ground voltage is applied to the second drive node.

5. The device of claim 1, wherein the precharge voltage has a voltage level of a half voltage source.

6. A semiconductor memory device, comprising:
   a memory cell array;
   a P-type bit line sense amplifier connected to the memory cell array, the P-type bit line sense amplifier including a first drive node;
   an N-type bit line sense amplifier connected to the memory cell array, the N-type bit line sense amplifier including a second drive node;
   a P-type sense amplifier driver applying an array voltage source to the first drive node in response to a P-type sense amplifier drive signal;
   an N-type sense amplifier driver applying a ground voltage source to the second drive node in response to an N-type sense amplifier drive signal;
   a precharge part generating a precharge voltage through first and second precharge nodes to precharge the first and second drive nodes to an equal voltage level; and
   a switching part operatively connecting the first precharge node to the first drive node and the second precharge node to the second drive node in response to the P-type and N-type sense amplifier drive signals applied during the data non-access mode.

7. The device of claim 6, wherein the precharge part generates the precharge voltage in response to an equalizing control signal applied during the data non-access mode.

8. The device of claim 6, wherein the switching part includes P-type and N-type MOS transistors.

9. The device of claim 6, wherein the precharge voltage has a voltage level of a half voltage source.

10. A semiconductor memory device, comprising:
    a memory cell array having memory cells that are respectively connected at crossing points between word lines and bit lines;
    a bit line pair connected to the memory cells;
    at least one P-type bit line sense amplifier connected to the bit line pair, the P-type bit line sense amplifier including a first drive node;
    at least one N-type bit line sense amplifier connected to the bit line pair, the N-type bit line sense amplifier including a second drive node;
    at least one P-type sense amplifier driver applying an array voltage source to the first drive node in response to a P-type sense amplifier drive signal applied during a data access mode;
    at least one N-type sense amplifier driver applying a ground voltage to the second drive node in response to an N-type sense amplifier drive signal applied during the data access mode; and
    wherein at least one precharge part is connected to each pair of the at least one P-type and the at least one N-type bit line sense amplifiers to precharge each of the first and second drive nodes to an equal voltage level.

11. The device of claim 10, wherein the memory cell array is configured in a matrix shape.

12. The device of claim 10, wherein each precharge part generates the precharge voltage in response to an equalizing control signal applied during the data non-access mode.

13. The device of claim 10, wherein the precharge voltage has a voltage level of a half voltage source.

14. A semiconductor memory device, comprising:
    a memory cell array having memory cells that are respectively connected at crossing points between word lines and bit lines;
    a bit line pair connected to the memory cells;
    at least one P-type bit line sense amplifier connected to the bit line pair, the P-type bit line sense amplifier including a first drive node;
    at least one N-type bit line sense amplifier connected to the bit line pair, the N-type bit line sense amplifier including a second drive node;

at least one P-type sense amplifier driver applying an array voltage source to the first drive node in response to a P-type sense amplifier drive signal applied during a data access mode;

at least one N-type sense amplifier driver applying a ground voltage to the second drive node in response to an N-type sense amplifier drive signal applied during the data access mode;

a precharge part precharging the first and second drive nodes to an equal voltage level; and a switching part operatively connecting the first and second precharge nodes to the first and second drive nodes in response to the P-type sense amplifier drive signal.

15. The device of claim 14, wherein the memory cell array is configured in a matrix shape.

16. The device of claim 14, wherein the precharge part generates the precharge voltage in response to an equalizing control signal applied during a data non-access mode.

17. The device of claim 14, wherein the switching part includes N-type MOS transistors.

18. The device of claim 14, wherein the precharge voltage has a voltage level of a half voltage source.

19. A method for driving power of a bit line sense amplifier in a semiconductor memory device having a bit line sense amplifier connected to a bit line pair, comprising:

applying a precharge voltage to first and second drive nodes of the bit line sense amplifier during a data non-access mode to precharge the first and second drive nodes to an equal voltage level;

shifting to a data access mode;

cutting off the precharge voltage applied to the first and second drive nodes of the bit line sense amplifier; and applying a cell array voltage source to the first drive node and a ground voltage to the second drive node.

20. An apparatus, comprising:

a first drive node;

a second drive node;

a precharge part including first and second precharge nodes; and a switching part operatively connecting the first and second precharge nodes to the first and second drive nodes, the precharge part generating a precharge voltage through the first and second precharge nodes to precharge the first and second drive nodes to an equal voltage level.

21. The apparatus of claim 20, wherein the switching part operatively connects the first and second precharge nodes to the first and second drive nodes in response to one or more drive signals applied only during a precharge state.

22. The apparatus of claim 20, wherein the precharge part generates the precharge voltage in response to one or more drive signals applied only during a precharge state.

23. The apparatus of claim 21, wherein the precharge state is a mode in which the apparatus does not access data.

24. The apparatus of claim 20, further comprising:

a memory cell array having memory cells that are respectively connected at crossing points between word lines and bit lines;

a bit line pair connected to the memory cells;

at least one P-type bit line sense amplifier connected to the bit line pair, the P-type bit line sense amplifier including the first drive node;

at least one N-type bit line sense amplifier connected to the bit line pair, the N-type bit line sense amplifier including the second drive node;

at least one P-type sense amplifier driver applying an array voltage source to the first drive node in response to a P-type sense amplifier drive signal applied during a data access mode; and at least one N-type sense amplifier driver applying a ground voltage to the second drive node in response to an N-type sense amplifier drive signal applied during the data access mode.

25. A method for driving power in a bit line sense amplifier which includes first and second drive nodes, comprising:

applying a precharge voltage to the first and second drive nodes during a precharge state to precharge the first and second drive nodes to an equal voltage level;

shifting to an operational state so as to cut off the applied precharge voltage; and applying driving voltages to the first and second drive nodes to power the bit line sense amplifier.

26. The method of claim 25, wherein the applying includes applying a cell array voltage source to the first drive node and a ground voltage to the second drive node.

27. The method of claim 25, wherein the precharging is performed in response to one or more drive signals applied only during the precharge state.

28. The method of claim 27, wherein the precharge state is embodied as a mode in which no data is accessed.

29. The method of claim 25, wherein the operational state is a mode in which one of a read operation and a write operation is performed.

30. A semiconductor memory device including the apparatus of claim 19.

31. An apparatus for driving power of a bit line sense amplifier in a semiconductor memory device having a bit line sense amplifier connected to a bit line pair, according to the method of claim 19.

32. An apparatus for driving power in a bit line sense amplifier which includes first and second drive nodes, according to the method of claim 25.

33. A semiconductor memory device having a bit line sense amplifier connected to a bit line pair, the semiconductor memory device driving power of the bit line sense amplifier according to the method of claim 19.

34. A semiconductor memory device having a bit line sense amplifier connected to a bit line pair, the semiconductor memory device driving power of the bit line sense amplifier according to the method of claim 25.

* * * * *